(12) United States Patent
Lindgren et al.

(10) Patent No.: US 10,516,402 B2
(45) Date of Patent: Dec. 24, 2019

(54) CORRUPTED CLOCK DETECTION CIRCUIT FOR A PHASE-LOCKED LOOP

(71) Applicant: TEXAS INSTRUMENTS INCORPORATED, Dallas, TX (US)

(72) Inventors: Eric Paul Lindgren, Bonney Lake, WA (US); Arvind Sridhar, Issaquah, WA (US); Jayawardan Janardhanan, Issaquah, WA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/232,893

(22) Filed: Dec. 26, 2018

(65) Prior Publication Data
US 2019/0280695 A1 Sep. 12, 2019

Related U.S. Application Data

(60) Provisional application No. 62/640,603, filed on Mar. 9, 2018.

(51) Int. Cl.
*H03L 7/085* (2006.01)
(52) U.S. Cl.
CPC ..................... *H03L 7/085* (2013.01)
(58) Field of Classification Search
CPC ................. H03L 7/085; H03L 7/099
(Continued)

(56) References Cited

U.S. PATENT DOCUMENTS

| 5,200,933 A | 4/1993 | Thornton et al. |
| 5,304,954 A | 4/1994 | Saito et al. |

(Continued)

FOREIGN PATENT DOCUMENTS

| EP | 0644657 | 3/1995 |
| EP | 3182592 | 6/2017 |

(Continued)

OTHER PUBLICATIONS

International Search Report in corresponding PCT Application No. PCT/US2019/021599 dated May 30, 2019 (2 pages).

(Continued)

*Primary Examiner* — John W Poos
(74) *Attorney, Agent, or Firm* — John R. Pessetto; Charles A. Brill; Frank D. Cimino

(57) ABSTRACT

A selection circuit receives a plurality of reference clocks. The selection circuit is controlled by a control signal to output one of the plurality of reference clocks. A phase-locked loop couples to an output of the selection circuit and uses the selected reference clock for phase locking an output clock. A plurality of reference clock window detector circuits is included. Each reference clock window detector circuit receives a separate reference clock. Each reference clock window detector circuit asserts an error signal responsive to an early reference clock edge error in which the reference clock window detector circuit detects a reference clock edge before expiration of an early time window. Further, each reference clock window detector circuit asserts the error signal responsive to a late reference clock edge error in which the reference clock window detector circuit detects a reference clock edge after expiration of a late time window.

18 Claims, 6 Drawing Sheets

(58) Field of Classification Search
USPC .......................................... 327/156, 158, 161
See application file for complete search history.

(56) References Cited

U.S. PATENT DOCUMENTS

| | | | |
|---|---|---|---|
| 5,796,682 | A | 8/1998 | Swapp |
| 5,959,502 | A | 9/1999 | Ovens et al. |
| 6,308,055 | B1 | 10/2001 | Welland et al. |
| 6,310,653 | B1 | 10/2001 | Malcolm, Jr. et al. |
| 6,584,574 | B1 | 6/2003 | Embree |
| 6,597,249 | B2 | 7/2003 | Chien et al. |
| 7,126,429 | B2 * | 10/2006 | Mitric ................... H03L 7/093 331/2 |
| 7,755,439 | B2 | 7/2010 | Yu et al. |
| 7,876,136 | B2 | 1/2011 | Ha et al. |
| 8,179,174 | B2 | 5/2012 | Bunch |
| 8,368,438 | B2 | 2/2013 | Furuta |
| 8,957,711 | B2 * | 2/2015 | Jin ..................... H03L 7/1075 327/156 |
| 9,020,089 | B2 | 4/2015 | Da Dalt |
| 9,490,820 | B2 | 11/2016 | Shiozaki |
| 9,634,826 | B1 | 4/2017 | Park et al. |
| 9,859,901 | B1 | 1/2018 | Chu et al. |
| 10,075,173 | B2 | 9/2018 | Sarda |
| 10,128,858 | B2 | 11/2018 | Goldberg et al. |
| 10,135,452 | B2 | 11/2018 | Cherniak et al. |
| 10,141,941 | B2 | 11/2018 | Petrov |
| 10,185,349 | B2 | 1/2019 | Musunuri et al. |
| 10,193,561 | B2 | 1/2019 | Lesso |
| 10,200,047 | B2 | 2/2019 | Markulic et al. |
| 10,291,214 | B2 | 5/2019 | Thijssen et al. |
| 2007/0085570 | A1 | 4/2007 | Matsuta |
| 2009/0015338 | A1 | 1/2009 | Frey |
| 2009/0219073 | A1 | 9/2009 | Sun et al. |
| 2009/0267664 | A1 | 10/2009 | Uozumi et al. |
| 2011/0234270 | A1 | 9/2011 | Kobayashi |
| 2011/0273210 | A1 | 11/2011 | Nagaraj |
| 2012/0056769 | A1 | 3/2012 | Wang et al. |
| 2012/0161834 | A1 | 6/2012 | Lee et al. |
| 2013/0051290 | A1 | 2/2013 | Endo et al. |
| 2014/0225653 | A1 | 8/2014 | Hara et al. |
| 2014/0266351 | A1 | 9/2014 | Na et al. |
| 2014/0266354 | A1 | 9/2014 | Boo et al. |
| 2015/0077279 | A1 | 3/2015 | Song et al. |
| 2015/0188553 | A1 | 7/2015 | Familia et al. |
| 2015/0372690 | A1 | 12/2015 | Tertinek et al. |
| 2016/0056827 | A1 | 2/2016 | Vlachoginnakis et al. |
| 2016/0156362 | A1 | 6/2016 | Kim et al. |
| 2016/0164532 | A1 | 6/2016 | Zhang et al. |
| 2016/0204787 | A1 | 7/2016 | Lotfy et al. |
| 2016/0238998 | A1 | 8/2016 | Pavlovic et al. |
| 2016/0352506 | A1 | 12/2016 | Huang |
| 2016/0380759 | A1 | 12/2016 | Kondo et al. |
| 2017/0187383 | A1 | 6/2017 | Lesso |
| 2017/0288686 | A1 | 7/2017 | Burg et al. |
| 2018/0269885 | A1 | 9/2018 | Kondo et al. |
| 2018/0351558 | A1 | 12/2018 | Kuo et al. |

FOREIGN PATENT DOCUMENTS

| | | |
|---|---|---|
| JP | H11143570 | 5/1999 |
| JP | 2009260866 | 11/2009 |
| WO | 2015161890 | 10/2015 |

OTHER PUBLICATIONS

Michael H. Perrott, "Tutorial on Digital Phase-Locked Loops;" CICC 2009. Sep. 2009 (118 pgs).
Texas Instruments Data Sheet LMK05028 Low-Jitter Dual-Channel Network Synchronizer Clock with EEPROM, Feb. 2018 (94 pages).
International Search Report in corresponding PCT Application No. PCT/US2019/030892 dated Aug. 1, 2019 (3 pages).
International Search Report in corresponding PCT Application No. PCT/US2019/021968 dated Jun. 13, 2019 (2 pages).
International Search Report in corresponding PCT Application No. PCT/US2019/021966 dated Jun. 20, 2019 (2 pages).

* cited by examiner

CORRUPTED CLOCK DETECTION CIRCUIT FOR A PHASE-LOCKED LOOP

RELATED APPLICATIONS

This application claims priority to U.S. Provisional Application No. 62/640,603, filed Mar. 9, 2018, which is hereby incorporated by reference.

BACKGROUND

A phase-locked loop (PLL) is an electrical circuit that generates an output dock that is phase-locked to an input reference dock. PLLs are used for a variety of purposes including, for example, communication systems, computers, and the like. PLLs can be digital PLLS (DPLL) or analog PLL (APLL).

SUMMARY

In at least one example, a circuit includes a selection circuit coupled to receive a plurality of reference clocks. The selection circuit is controlled by a control signal to output one of the plurality of reference clocks. A phase-locked loop is coupled to an output of the selection circuit and uses the output reference clock from the selection circuit for phase locking an output clock generated by the phase-locked loop. A plurality of reference clock window detector circuits is included. Each reference clock window detector circuit is coupled to receive a separate one of the plurality of reference clocks. Each reference clock window detector circuit asserts an error signal responsive to an early reference clock edge error in which the reference clock window detector circuit detects a reference clock edge before expiration of an early time window. Further, each reference clock window detector circuit asserts the error signal responsive to a late reference clock edge error in which the reference clock window detector circuit detects a reference clock edge after expiration of a late time window.

In another example, a method includes detecting a first error condition corresponding to a first edge of a reference clock occurring before expiration of a first counter, detecting a second error condition corresponding to a second edge of the reference clock occurring after expiration of a second counter, asserting an error signal responsive to detection of the first error condition, and asserting the error signal responsive to detection of the second error condition.

BRIEF DESCRIPTION OF THE DRAWINGS

For a detailed description of various examples, reference will now be made to the accompanying drawings in which.

DETAILED DESCRIPTION

As noted above, a PLL phase locks an output clock to a reference clock. The reference clock should have a constant frequency and thus constant period. However, it is possible that the period can vary from cycle to cycle of a reference clock. Jitter or other effects may cause a variation in the period of a reference clock. A PLL should detect a corrupted reference clock as quickly as possible to eliminate phase perturbation on the PLL's output clock.

Figure 1:
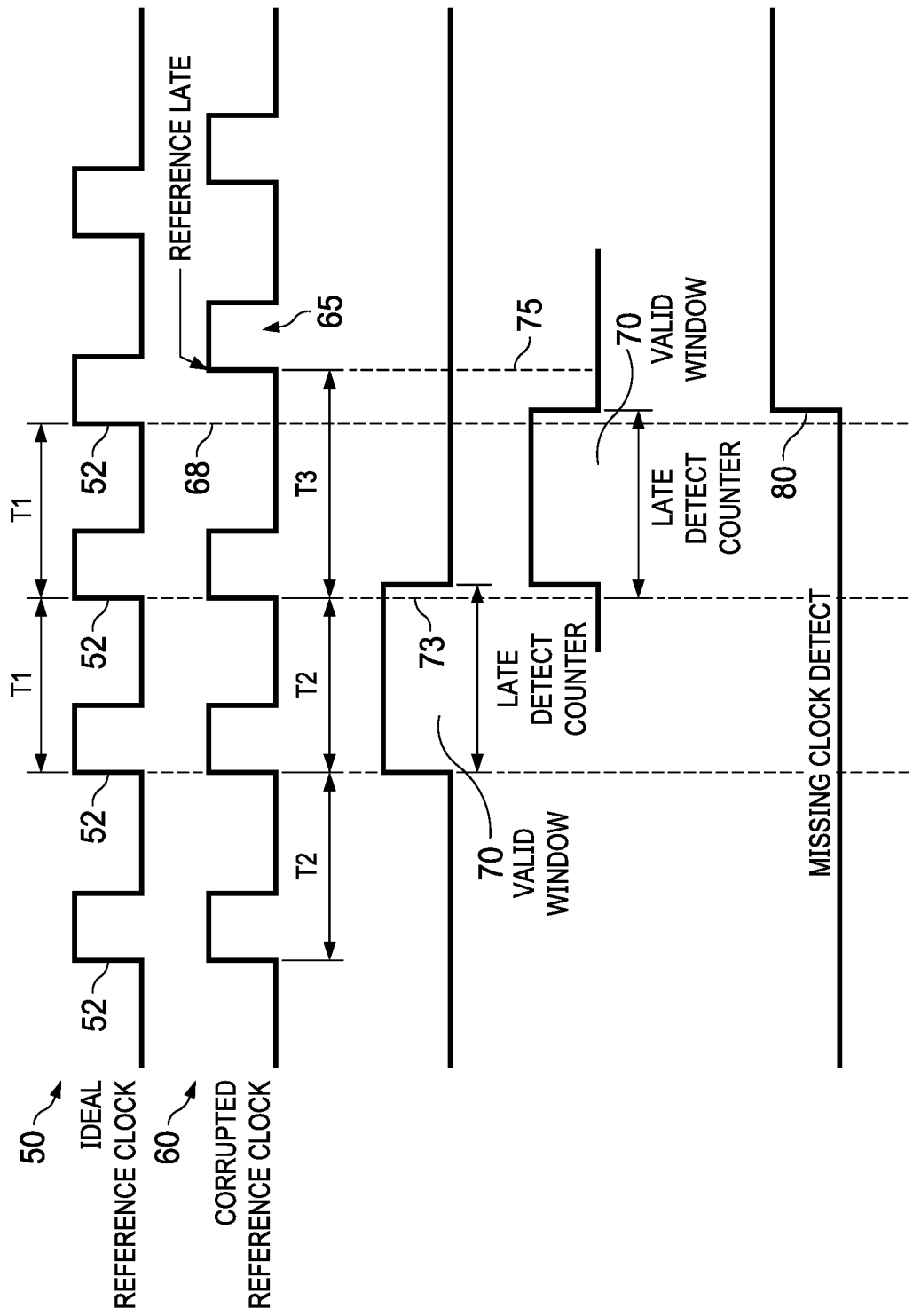
FIG. 1 is a timing diagram illustrating a late reference clock.

Some PLLs include a missing clock detection capability as illustrated in FIG. 1. FIG. 1 illustrates several cycles of an ideal reference clock 50 and a corrupted reference clock 60. The ideal reference clock 50 has rising edges that occur at relatively fixed time periods. That is, the time period (T1) of each cycle of the ideal reference clock 50 does not vary, or least by so little so as not to cause performance issues in a PLL that uses the ideal reference clock. The first two cycles of the corrupted reference clock 60 have a constant period of T2 as shown. However, pulse 65 of the corrupted reference clock 60 has a rising edge that is substantially delayed from where it should have been (as denoted by dashed line 68).

Some PLL systems include a late clock detection capability in which a valid window 70 is implemented. If the next clock edge is detected before the current valid window 70 ends (as illustrated at 73), then that clock cycle is deemed to be valid. However, if the valid window 70 ends before the next reference clock edge (e.g., edge 75) occurs, a missing clock detect signal 80 is generated and the PLL system responds in a suitable manner.

While generally satisfactory for detecting a late or missing clock, early clocks cannot be detected with this scheme. An early clock (i.e., a clock edge that occurs substantially before it should have occurred) can also impair the performance of a PLL. The examples described herein advantageously detect both early and late clocks.

Figure 2:
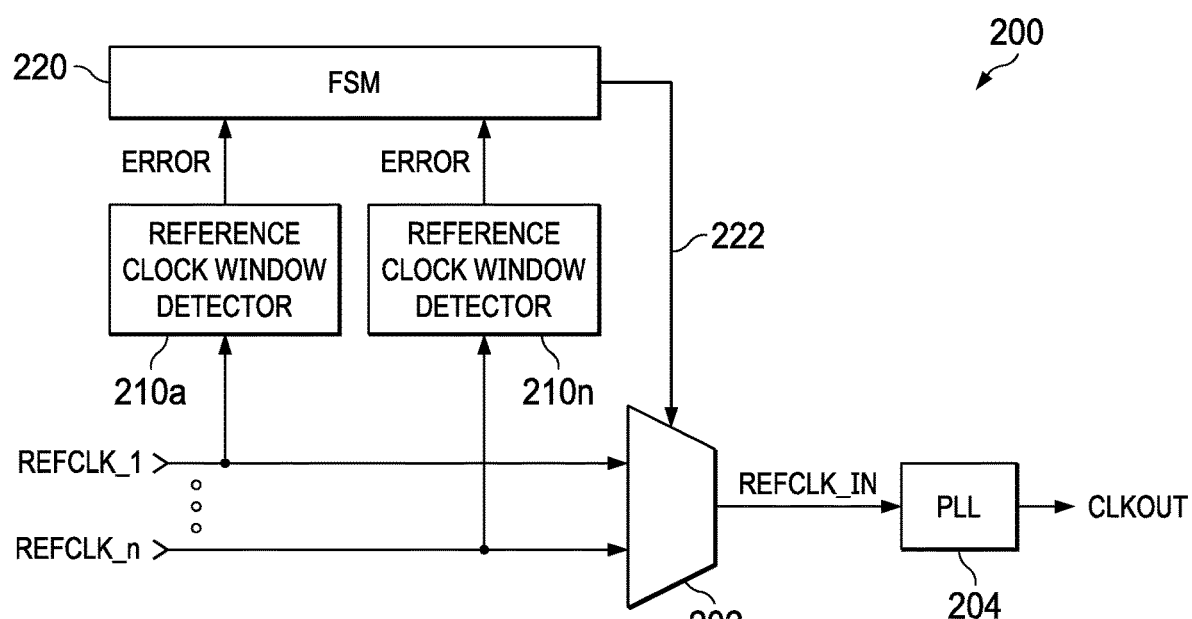
FIG. 2 shows a schematic of a circuit that implements an early time window and a late time window to detect early or late reference clock edges.

FIG. 2 shows an example of a circuit 200 that detects both early and late reference clocks. The circuit shown in the example of FIG. 2 includes a selection circuit 202, a PLL 204, reference clock window detector circuits 210, and a finite state machine (FSM) 220. The selection circuit 202 may comprise a multiplexer (such as is shown in FIG. 2) or other form of selection circuit, and is referred to as a multiplexer 202 herein. One or more reference clocks (REFCLK_1 through REFCLK_n) are provided to inputs of the multiplexer 202, which selects one of the input reference clocks as an input reference clock (REFCLK_IN) to the PLL 204. The PLL 204 may comprise a DPLL and/or an APLL.

Each REFCLK_1 through REFCLK_n is provided to a separate reference clock window detector 210. REFCLK_1 is provided to reference clock window detector 210a and REFCLK_n is provided to reference clock window detector 210n (reference clock window detector circuits 210a through 210n collectively referred to as reference clock window detector circuits 210). Each of the reference clock window detector circuits 210 asserts an error signal (ERROR) to the FSM 220 to indicate whether an early or late error condition has been detected for the corresponding reference clock. For example, ERROR asserted high indicates an early or late error condition and ERROR being low indicates absence of either kind of early/late error, or vice versa. Each reference clock window detector 210 asserts ERROR responsive to an early reference clock edge error in which the reference clock window detector circuit detects a reference clock edge before expiration of an early time window. Each reference clock window detector circuit also asserts ERROR responsive to a late reference clock edge error in which the reference clock window detector circuit detects a reference clock edge after expiration of a late time window. Thus, two separate time windows are implemented—one for the detection of an erroneously early reference clock and the other for the detection of an erroneously late reference clock. In this example, ERROR being asserted to the FSM 220 does not distinguish as to which type of error condition has occurred—either way a reference clock error has occurred and the FSM 220 will take corrective action.

If one of REFCLK_1 through REFCLK_n is currently being selected through multiplexer 202 to provide REFCLK_IN to the PLL 204 and the reference clock window detector 210 for that particular reference clock detects an early or late condition, that reference clock window detector asserts is ERROR signal to the FSM 220. In response, the FSM 220 monitors the ERROR signals from the other reference clock window detectors 210, selects another reference clock (assuming the corresponding reference clock window detector has not also actively asserted its ERROR signal), and asserts the control signal 222 to the multiplexer 202 to switch to a different reference clock. The selection of which reference clock to use, to the extent multiple other reference clocks are provided to the multiplexer 202, is preconfigured into the FSM logic in some examples.

Figure 3:
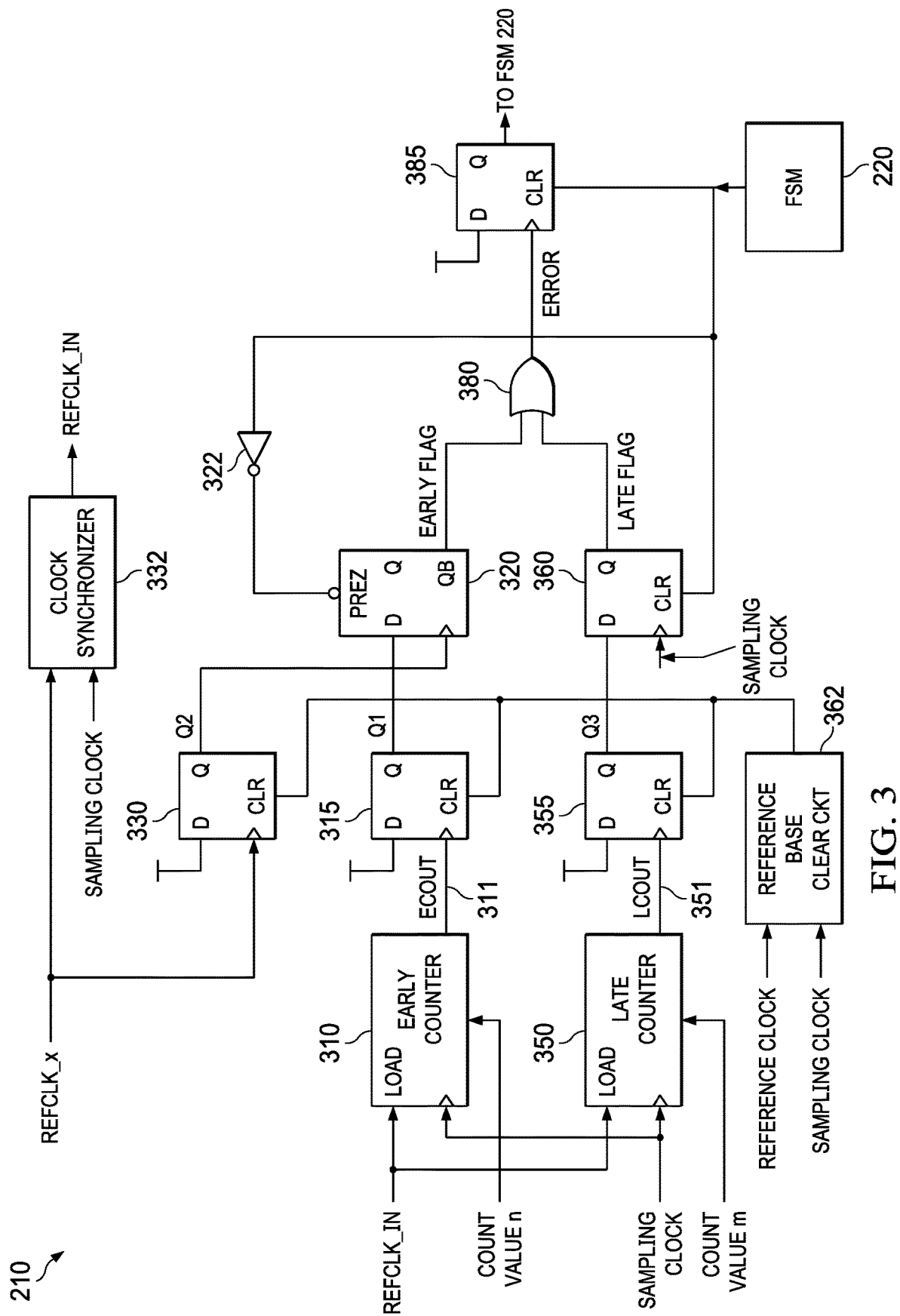
FIG. 3 shows an example implementation of a reference clock window detector usable in the schematic of FIG. 2.

FIG. 3 provides an example implementation of a reference clock window detector 210. This example implementation includes an early counter 310, a late counter 350, flip-flops 315, 320, 330, 355, 360, and 385, inverter 322, OR gate 380, clock synchronizer 332, and reference-based clear circuit 362. A sampling clock is provided to clock the early counter 310 and the late counter 350. The sampling clock is derived from a high frequency oscillator and then divided down to a suitable sampling frequency, which is greater than the frequency of the reference clock, REFCLK_x. The clock synchronizer circuit 332 synchronizes REFCLK_x to the sampling clock and may include one or more flip-flops for this purpose. The output from the clock synchronizer is labeled as REFCLK_IN, which is provided to the load inputs of the early and late counters 310, 350.

Assertion of load input (e.g., a rising edge of REFCLK_IN) causes each counter 310, 350 to reset itself to an initial count value and to begin counting pulse of the sampling clock. The initial count value is set to be different between the two counters so as to implement a late window that is longer than an early window. The count value for the early counter 310 is shown as "n" and for the late counter 350 is shown a "m". The value m is larger than the value n in this example.

In the example of FIG. 3, the counters 310, 350 are count-down counters in that, following a reset event, each counter starts counting down from its programming count value (n or m as shown) to zero. The output of each counter 310, 350 is low while counting down until the terminal value (0) is reached, at which point the output is asserted high. That is, when the early counter 310 reaches 0, its output 311 (labeled as early counter output, ECOUT) is asserted. Similarly, when the late counter 350 reaches 0, its output 351 (labeled as late counter output, LCOUT) is asserted. The output 311 of early counter 311 is provided to the clock input of flip-flop 315 and the output 351 of late counter 350 is provided to the clock input of flip-flop 355. The data (D) inputs of both flip-flops 315 and 355 are tied to a logic high level. Thus, if and when the early counter 310 reaches 0, its output transitions from low to high thereby clocking a logic high on the Q output (labeled as Q1) of flip-flop 315. Similarly, if and when the late counter 350 reaches 0, its output transitions from low to high thereby clocking a logic high on the Q output (labeled as Q3) of flip-flop 355.

The Q outputs of flip-flops 315 and 355 are provided to the data inputs of flips-flops 320 and 360, respectively. The sampling clock is used to clock flip-flop 360. Flip-flop 320 is clocked by the Q output (labeled as Q2) of flip-flop 330. The Q bar (QB) output of flip-flop 320 is a signal labeled as EARLY FLAG. Flip-flop 330 is clocked by REFCLK_x. The Q output of flip-flop 360 is a signal labeled as LATE FLAG. Absent an early reference clock, the QB output (EARLY FLAG) of flip-flop 320 is logic low. Similarly, absent a late reference clock, the Q output (LATE FLAG) of flip-flop 360 also is logic low. The data input of flip-flop 330 is tied to a logic high. The Q output of flip-flop 330 transitions from low to high upon a rising edge of REFCLK_X. Flip-flop 330 is used to introduce a small time delay so that a subsequent edge of REFCLK_x is used to clock flip-flop 330 from the edge of REFCLK_x (REFCLK_IN) that resets the early counter 310.

OR gate 380 is coupled to the QB output of flip-flop 320 and the Q output of flip-flop 360 to logically OR together EARLY FLAG and LATE FLAG to generate an ERROR signal. Flip-flop 385 functions as a latch to hold ERROR on its Q output to the FSM 220. The ERROR signal to the FSM 220 can be either the output of OR gate 380 or the latched output from flip-flop 385.

The following discussion explains the operation of the early window to detect an early reference clock. For the early reference clock detection, while early counter 310 is counting down, but before its terminal count is reached, the output 311 of the early counter is 0 and the Q output of flip-flop 315 is 0. Flip-flop 320 has been preset by the output of inverter 322 (via FSM 220) and thus its QB output (EARLY FLAG) is logic 0. Upon occurrence of an early reference clock (i.e., a reference clock rising edge that occurs after the early counter 310 has been reset and is counting down but before the early counter 310 reaches 0), flip-flop 330 is clocked thereby forcing its Q output to transition from low to high and clocking flip-flop 320. Flip-flop 320 at this point is clocked with its D input being 0 which then causes EARLY FLAG to transition to a high logic level and ERROR is asserted high via OR gate 380.

The following discussion explains the operation of the late window to detect a late reference clock. For the late reference clock detection, while late counter 350 is counting down, but before its terminal count is reached, the output 351 of the late counter is 0 and the Q output of flip-flop 315 is 0. Flip-flop 360 has been cleared by the FSM 220, and thus its Q output (LATE FLAG) is logic 0. Once the late counter 350 counts down to 0, flip-flop 355 is then clocked thereby forcing the Q output of flip-flop 355 to a logic high level, which in turn forces the Q output of flip-flop 360 (LATE) FLAG to become logic high upon the next rising edge of the sampling clock. OR gate 380 then causes its ERROR output signal to become logic high in response to LATE FLAG being high. Had the next rising edge of REFCLK_x occurred before the late counter 350 expired, the late counter 350 would have been reset by the REFCLK_x edge and not permitted to count down to 0.

The reference-based clear circuit 362 generates a clear signal to clear flip-flops 330, 315 and 355 responsive to REFCLK_IN. In one example, the reference-based clear circuit 362 asserts the clear signal high upon a rising edge of REFCLK_IN and de-asserts the clear signal upon the next sampling clock rising edge.

Figure 4:
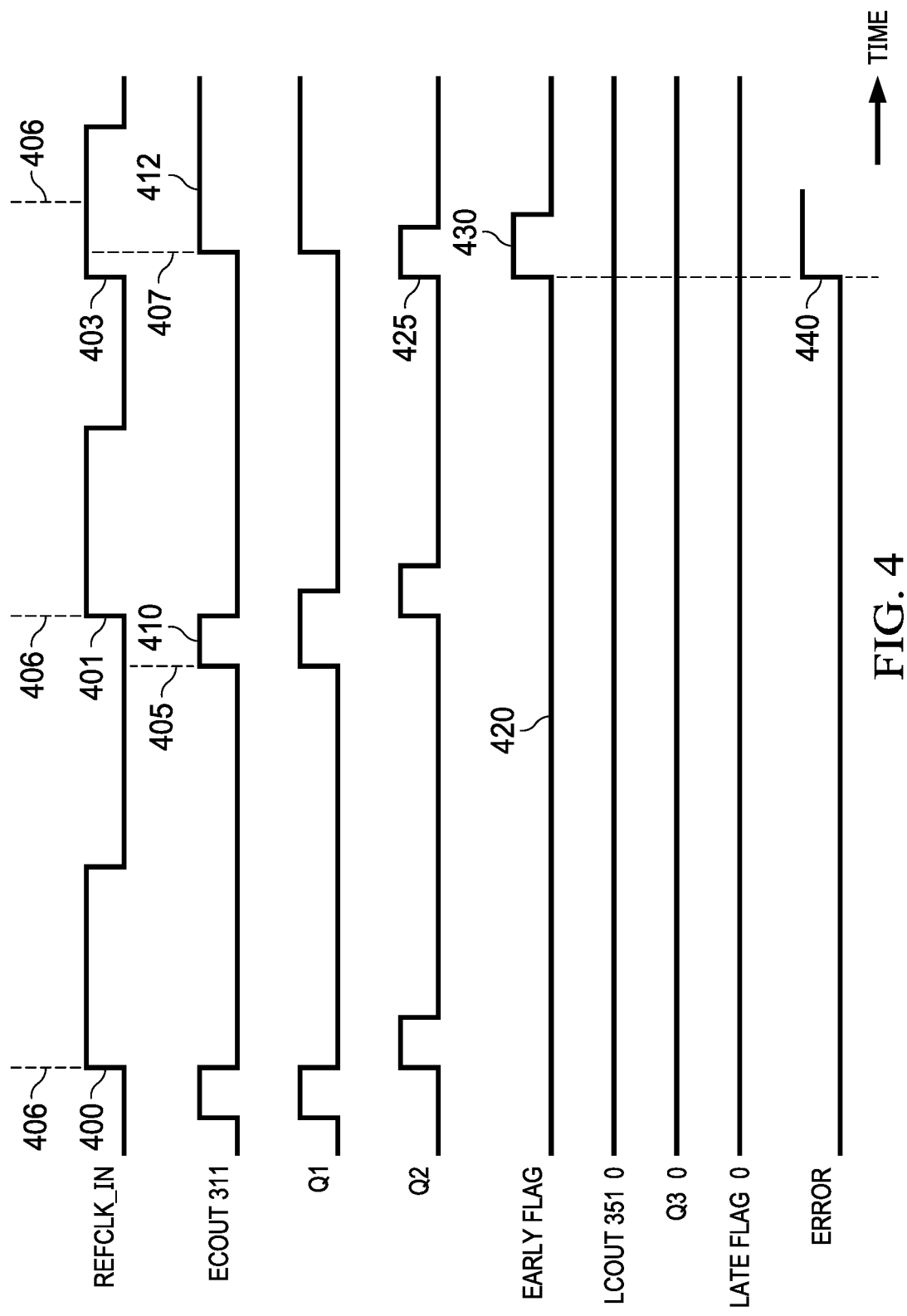
FIG. 4 is a timing diagram illustrating the circuit's operation upon occurrence of an early clock.

FIG. 4 is a timing diagram further illustrating the operation of a reference clock window detector circuit 210. The signals shown include REFCLK_IN, ECOUNT 311, LCOUNT 351, Q1, Q2, Q3, EARLY FLAG, LATE FLAG, and ERROR. Three cycles of REFCLK_IN are shown having rising edges 400, 401 and 403. Dashed lines 406 indicate when rising edges of REFCLK_IN should occur in the absence of any early or late perturbations in the reference clock. In this example, rising edge 401 occurs at an appropriate time (not too early and not too late), but rising edge 403 occurs early. The early counter 310 begins counting from its initial count value towards zero upon rising edge 400 of REFCLK_IN and counts down to zero, thereby defining the early window, at time point 405. The early counter 310 is again reset at rising edge 401 and again counts down to zero at time point 407. Once the early counter 310 reaches zero, its ECOUT 311 is asserted high as shown at 410. Once rising edge 401 occurs, the early counter 310 is again reset and ECOUT is forced back to a logic low level. ECOUT again becomes logic high at 412 upon the early counter 310 again reaching 0.

EARLY FLAG remains logic low when Q2 is asserted high as long as Q1 is logic high. The rising edge 401 occurs after the expiration of the early window which ends at 405, and thus the EARLY FLAG remains at a logic 0 level as shown at 420 because Q1 is high when Q2 becomes high. EARLY FLAG is asserted high at 430 because Q1 is low when Q2 experiences rising edge 425. As soon as EARLY FLAG is asserted high, ERROR is also asserted high at 440 from ORE gate 380 and/or from latching flip-flop 385.

Upon each rising edge of REFCLK_IN, both counters 310, 350 are reset. Late counter 350 is reset and before it reaches zero, and thus LCOUT remains low as shown. With LCOUT being low, the LATE FLAG remains low as well.

Figure 5:
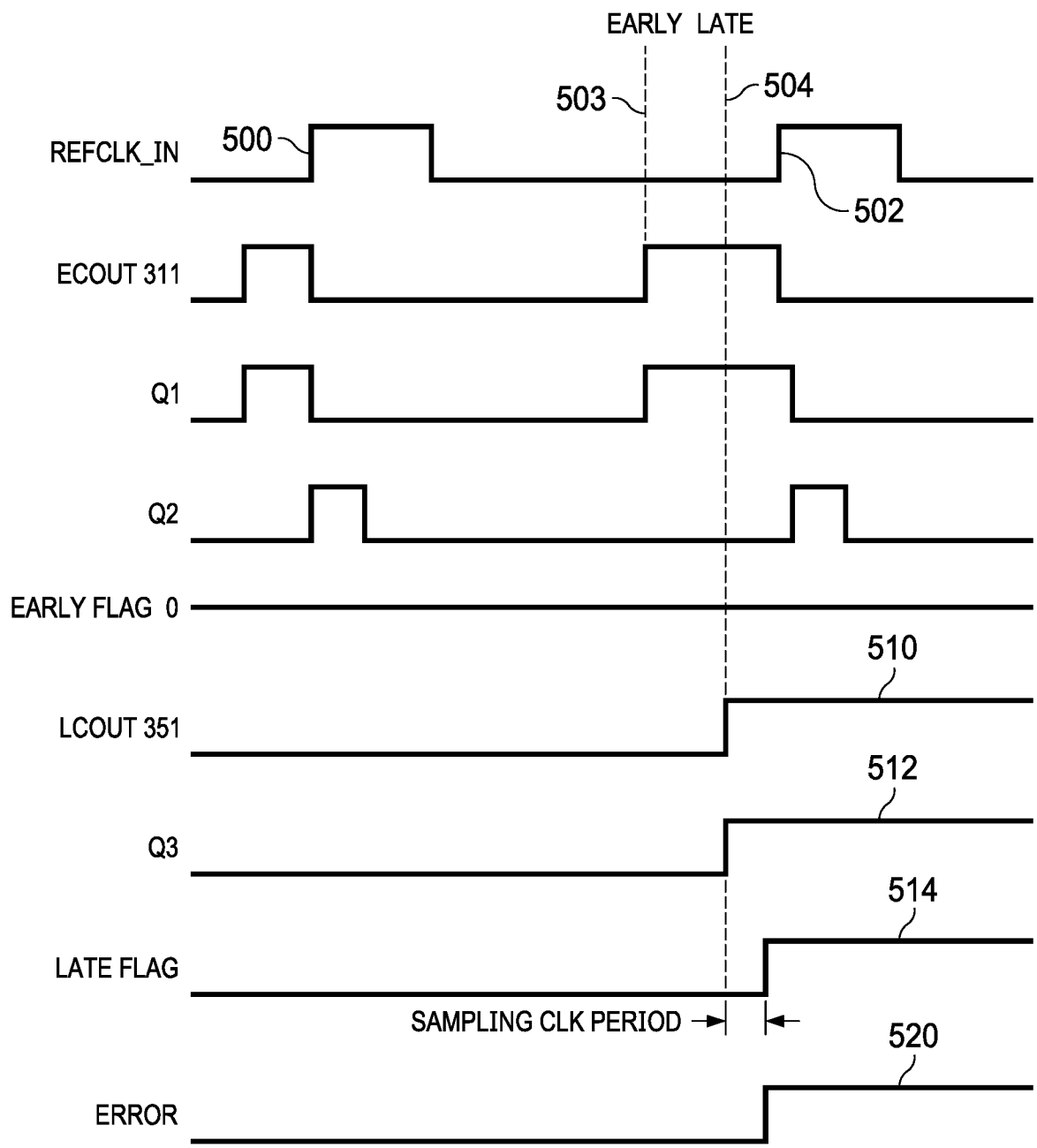
FIG. 5 is a timing diagram illustrating the circuit's operation upon occurrence of a late clock.

FIG. 5 shows a timing diagram to illustrate the operation of the reference clock window detector 210 in the case of a late reference clock. Rising edge 502 occurs late in this example. Dashed line 503 indicates the end of the early time window counted by early counter 310 and dashed line 504 indicates the end of the late time window counted by late counter 350. Rising edge 502 of REFCLK_IN occurs after the end of the late window (504). When that occurs, LCOUT is already high (510) due to the late counter 350 having reached 0 and thus Q3 also is forced high (512) by flip-flop 355. Upon the next edge of the sampling clock, LATE FLAG also is forced high at 514. LATE FLAG being high causes OR gate 380 to assert ERROR high as well as is shown at 520.

Figure 6:
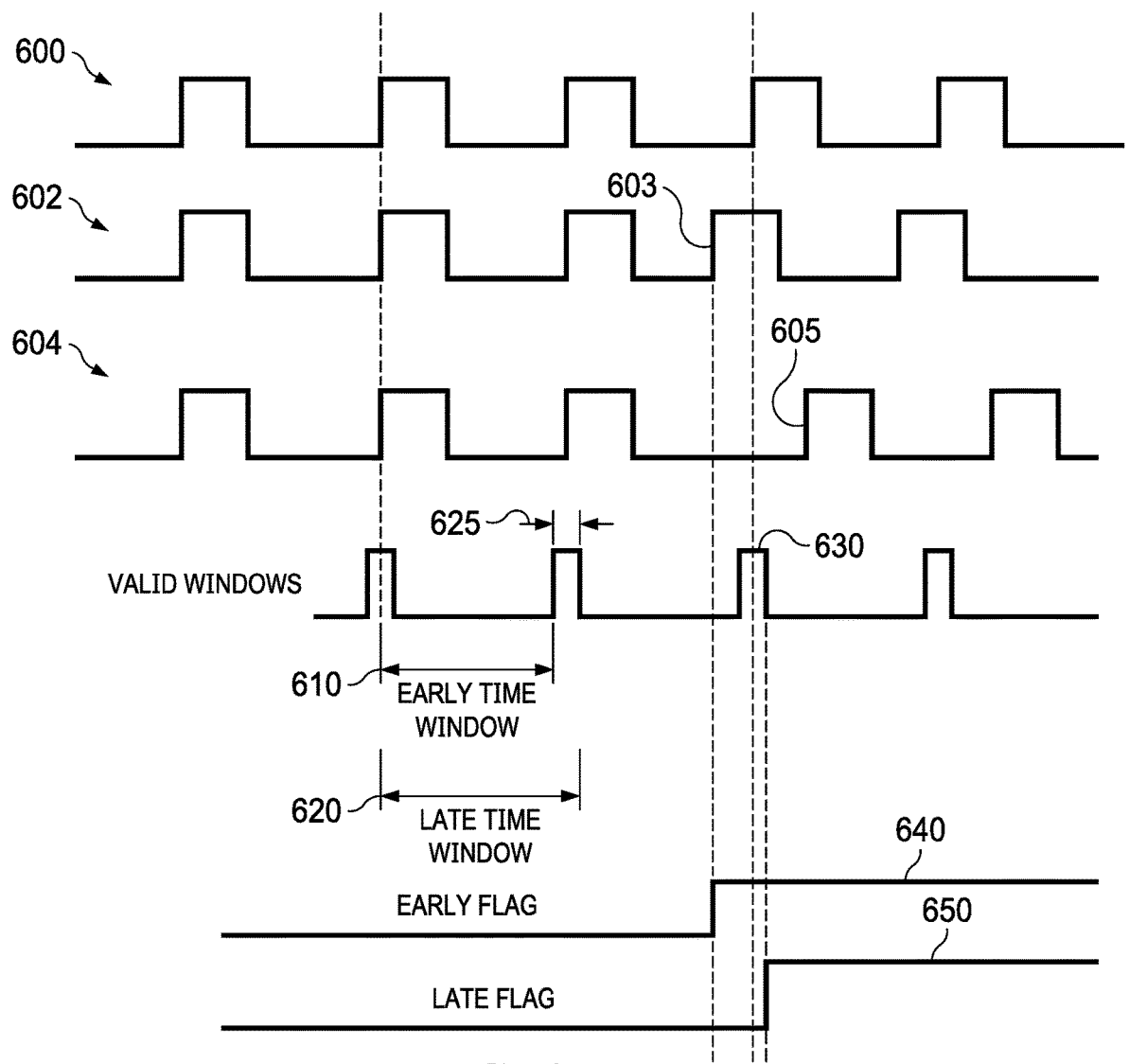
FIG. 6 illustrates the early and late time windows implemented by the reference clock window detector of FIG. 3.

FIG. 6 illustrates the early time window 610 implemented via early counter 310 and the late time window 620 implemented via late counter 350. Each early time window 610 and each late time window 620 begin upon a rising edge of REFCLK_IN. The early time window 610 ends based on the count value of early counter 310 which is smaller than the count value for the late counter 350. The time 625 between the expiration of the early time window 610 and the expiration of the late time window 620 is a valid window during which a rising edge of REFCLK_IN should occur, assuming a valid REFCLK_IN is present.

Waveform 600 shows multiple cycles of an ideal reference clock. Waveform 602 shows an example of reference clock in which one of the edges 603 occurs prematurely. Waveform 602 shows an example of reference clock in which one of the edges 605 occurs too late. Edge 603 occurs before the valid time window 630 starts, a condition which causes EARLY FLAG to be asserted high (640). Edge 605 occurs after the expiration of the valid time window 630 starts, a condition which causes LATE FLAG to be asserted high (650).

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:
1. A circuit, comprising:
 a selection circuit coupled to receive a plurality of reference clocks, the selection circuit controlled by a control signal to output one of the plurality of reference clocks;
 a phase-locked loop coupled to an output of the selection circuit and to use the output reference clock from the selection circuit for phase locking an output clock from the phase-locked loop; and
 a plurality of reference clock window detector circuits, each reference clock window detector circuit coupled to receive a separate one of the plurality of reference clocks, and wherein each reference clock window detector circuit asserts an error signal responsive to an early reference clock edge error in which the reference clock window detector circuit detects a reference clock edge before expiration of an early time window;
 wherein each reference clock window detector circuit asserts the error signal responsive to a late reference clock edge error in which the reference clock window detector circuit detects a reference clock edge after expiration of a late time window;
 wherein each reference clock window detector circuit includes:
 a first counter to count a sampling clock for a period of time corresponding to the early time window, and
 a second counter to count the sampling clock for a period of time corresponding to the late time window.
2. A circuit, comprising:
 a selection circuit coupled to receive a plurality of reference clocks, the selection circuit controlled by a control signal to output one of the plurality of reference clocks;
 a phase-locked loop coupled to an output of the selection circuit and to use the output reference clock from the selection circuit for phase locking an output clock from the phase-locked loop; and
 a plurality of reference clock window detector circuits, each reference clock window detector circuit coupled to receive a separate one of the plurality of reference clocks, and wherein each reference clock window detector circuit asserts an error signal responsive to an early reference clock edge error in which the reference clock window detector circuit detects a reference clock edge before expiration of an early time window;
 wherein each reference clock window detector circuit asserts the error signal responsive to a late reference clock edge error in which the reference clock window detector circuit detects a reference clock edge after expiration of a late time window;
 wherein each reference clock window detector circuit includes a first counter and a second counter, and the first counter to be programmed with a different count value than the second counter.
3. The circuit of claim 1, wherein each reference clock window detector circuit further includes a digital circuit coupled to outputs first and second counters to generate the error signal, the digital circuit including a plurality of flip-flops.

4. The circuit of claim 3, wherein the digital circuit includes a first flip-flop coupled to the output of the first counter and a second flip-flop coupled to the output of the second counter.

5. A circuit, comprising:
a selection circuit coupled to receive a plurality of reference clocks, the selection circuit controlled by a control signal to output one of the plurality of reference clocks;
a phase-locked loop coupled to an output of the selection circuit and to use the output reference clock from the selection circuit for phase locking an output clock from the phase-locked loop; and
a plurality of reference clock window detector circuits, each reference clock window detector circuit coupled to receive a separate one of the plurality of reference clocks, and wherein each reference clock window detector circuit asserts an error signal responsive to an early reference clock edge error in which the reference clock window detector circuit detects a reference clock edge before expiration of an early time window;
wherein each reference clock window detector circuit asserts the error signal responsive to a late reference clock edge error in which the reference clock window detector circuit detects a reference clock edge after expiration of a late time window;
wherein each reference clock window detector circuit includes:
a first flip-flop to generate an early flag responsive to the early reference clock edge error;
a second flip-flop to generate a late flag responsive to the late reference clock edge error; and
a logic gate coupled to both the first and second flip-flops, the logic gate to generate the error signal.

6. The circuit of claim 5, wherein the logic gate comprises an OR gate.

7. A circuit, comprising:
a selection circuit coupled to receive a plurality of reference clocks, the selection circuit controlled by a control signal to output one of the plurality of reference clocks;
a phase-locked loop coupled to an output of the selection circuit and to use the output reference clock from the selection circuit for phase locking an output clock from the phase-locked loop; and
a plurality of reference clock window detector circuits, each reference clock window detector circuit coupled to receive a separate one of the plurality of reference clocks, and wherein each reference clock window detector circuit asserts an error signal responsive to an early reference clock edge error in which the reference clock window detector circuit detects a reference clock edge before expiration of an early time window;
wherein each reference clock window detector circuit asserts the error signal responsive to a late reference clock edge error in which the reference clock window detector circuit detects a reference clock edge after expiration of a late time window;
further including a finite state machine coupled the plurality of reference clock window detector circuits, the finite state machine is to assert the control signal to the selection circuit to select a different reference clock from a currently selected reference clock for the phase-lock loop responsive to an error signal asserted by the reference clock window detector circuit coupled to receive the currently selected reference clock.

8. A circuit, comprising:
a first counter including a first clock input, a first load input, and a first count output;
a second counter including a second clock input, a second load input, and a second count output, the first and second clock inputs coupled to receive a same sampling clock and the first and second load inputs coupled to receive a reference clock;
a digital circuit coupled to the first and second count outputs, the digital circuit to generate an error signal responsive to receipt of a clock edge of the reference clock before the first counter reaches its terminal count; and
the digital circuit is to generate the error signal responsive to receipt of a clock edge of the reference clock after the second counter reaches its terminal count.

9. The circuit of claim 8, wherein the first and second counters are to count for different numbers of edges of the sampling clock.

10. The circuit of claim 8, wherein the digital circuit includes a first flip-flop coupled to receive the first count output and a second flip-flop coupled to receive the second count output.

11. The circuit of claim 8, further including:
a first flip-flop to generate a first error flag responsive to a reference clock edge occurring before the first counter reaches its terminal count; and
a second flip-flop to generate a second flag responsive to a reference clock edge occurring after the second counter reaches its terminal count.

12. The circuit of claim 11, further including a logic gate coupled to both the first and second flip-flops, the logic gate to generate an error signal responsive to assertion of either the first or second flag.

13. The circuit of claim 12, wherein the logic gate comprises an OR gate.

14. The circuit of claim 8, further comprising a phase-locked loop coupled to receive the reference clock.

15. The circuit of claim 8, wherein the first and second counters comprise count-down counters.

16. A method, comprising:
detecting a first error condition corresponding to a first edge of a reference clock occurring before expiration of a first counter;
detecting a second error condition corresponding to a second edge of the reference clock occurring after expiration of a second counter;
asserting an error signal responsive to detection of the first error condition; and
asserting the error signal responsive to detection of the second error condition.

17. The method of claim 16, wherein detecting the first error condition includes causing a first counter to count for a first time window and wherein detecting the second error condition includes causing a second counter to count for a second time window different in length than the first time window.

18. The method of claim 16, further comprising selecting a difference reference clock for a phase-locked loop based on the error signal.

* * * * *